United States Patent [19]

Sato

[11] Patent Number: 5,336,640
[45] Date of Patent: Aug. 9, 1994

[54] METHOD OF MANUFACTURING A SEMICONDUCTOR DEVICE HAVING AN INSULATING LAYER COMPOSED OF A BPSG FILM AND A PLASMA-CVD SILICON NITRIDE FILM

[75] Inventor: Nobuyoshi Sato, Chiba, Japan

[73] Assignee: Kawasaki Steel Corporation, Japan

[21] Appl. No.: 826,145

[22] Filed: Jan. 27, 1992

[30] Foreign Application Priority Data

Jan. 28, 1991 [JP] Japan .................. 3-25240

[51] Int. Cl.$^5$ ........................... H01L 21/316
[52] U.S. Cl. ................... 437/240; 437/241
[58] Field of Search ................ 437/240, 241

[56] References Cited

U.S. PATENT DOCUMENTS

| 4,600,624 | 7/1986 | Joseph et al. | |
| 4,786,612 | 11/1988 | Yau et al. | 437/47 |
| 4,845,054 | 7/1989 | Mitchener | 437/238 |
| 4,879,253 | 11/1989 | Wakamatsu | 437/41 |
| 4,962,065 | 10/1990 | Brown et al. | 437/242 |
| 5,028,566 | 7/1991 | Lagendiik | 437/238 |
| 5,132,774 | 7/1992 | Matsuura et al. | 357/71 |
| 5,166,088 | 11/1992 | Veda et al. | 437/47 |
| 5,166,101 | 11/1992 | Lee et al. | 437/238 |

FOREIGN PATENT DOCUMENTS

| 0212691 | 3/1987 | European Pat. Off. | |
| 0339385 | 11/1989 | European Pat. Off. | 437/240 |
| 0436185 | 12/1989 | European Pat. Off. | |
| 0366343 | 5/1990 | European Pat. Off. | 437/240 |
| 0421203 | 4/1991 | European Pat. Off. | |
| 0485086 | 5/1992 | European Pat. Off. | 437/240 |
| 63-202046 | 8/1988 | Japan . | |
| 1171229 | 7/1989 | Japan . | |
| 2250356 | 10/1990 | Japan | 437/240 |

OTHER PUBLICATIONS

Y. Nishimoto et al., "Low Temperature Chemical Vapor Deposition of Dielectric Films using Ozone and Organosilane", 19th Conf. Solid State Devices, Aug. 1987, 447-50.

Y. Nishimoto et al., "Dielectric Film Deposition by Atmospheric Pressure and Low Temperature . . . ", VMIC Conference, Jun. 1989, pp. 382-389.

Y. Ikeda et al., "Ozone/Organic-Source APCVD for ULSI Reflow Glass Films", NEC Research and Development, Jul. 1989, No. 94, pp. 1-7.

Primary Examiner—Olik Chaudhuri
Assistant Examiner—Ken Horton
Attorney, Agent, or Firm—Oliff & Berridge

[57] ABSTRACT

A semiconductor device including a semi-conductor substrate having active regions formed therein, at least one metal wiring pattern formed on the semiconductor substrate, and a final insulating layer formed on the metal wiring pattern. The final insulating layer is made of a borophosphosilicate glass and a plasma CVD silicon nitride film formed on the borophosphosilicate glass film. The borophosphosilicate glass film is formed by a chemical vapor deposition by supplying a gaseous mixture of organic silane, alkoxides of boron and phosphorus and ozone into a reaction vessel under the atmospheric pressure. The thus formed borophosphosilicate glass film has excellent step coverage, so that the plasma CVD film can be formed to have a uniform thickness. Further the plasma CVD film has excellent moisture resistance and water proof properties, and thus the whole insulating layer is particularly suitable as the final passivation layer of the semiconductor device.

12 Claims, 2 Drawing Sheets

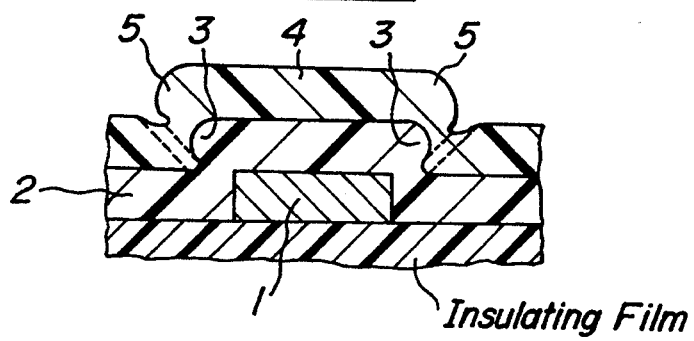
FIG_1
PRIOR ART
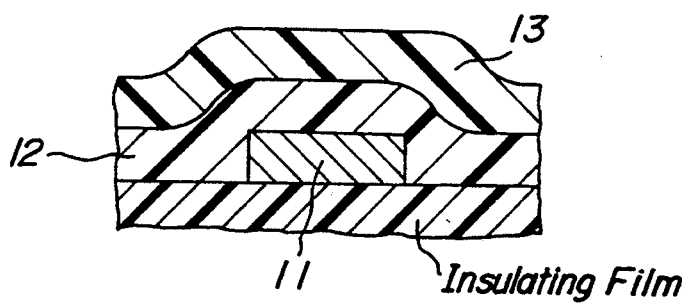
FIG_2
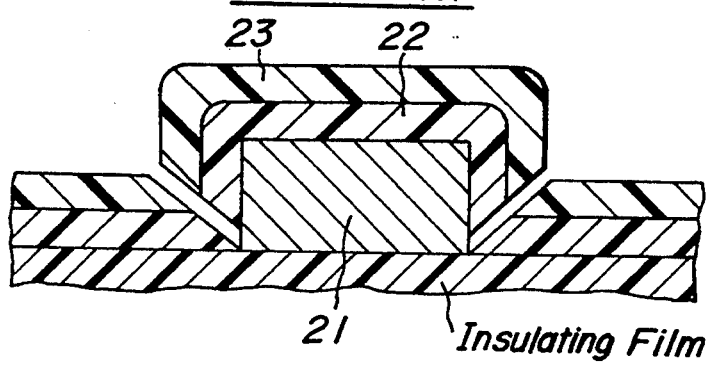
FIG_3
PRIOR ART

METHOD OF MANUFACTURING A SEMICONDUCTOR DEVICE HAVING AN INSULATING LAYER COMPOSED OF A BPSG FILM AND A PLASMA-CVD SILICON NITRIDE FILM

BACKGROUND OF THE INVENTION

1. Field of the Invention

The present invention relates to a semiconductor device comprising a semiconductor substrate and an insulating layer which may serve as a primary insulating film for passivating active regions formed in the semiconductor substrate, an interlayer-insulating film provided between metal wiring layers and a final insulating film applied on an uppermost surface of the semiconductor device. The invention also relates to a method of manufacturing such an insulating layer.

2. Description of the Related Art

The final passivation film applied on the uppermost surface of a semiconductor device should have such properties that the introduction of impurities into a semiconductor chip can be prevented and the impurities are held in the passivation film due to its gettering effect. Further, it is required that the insulating film be formed at a low temperature and have excellent mechanical, physical and chemical properties.

It has been proposed to form the final insulating layer by a PSG (phosphosilicate glass) film which has a good gettering function for alkali ions and which can be formed at a lower temperature. However, it is well known that the PSG film has poor moisture resistance and waterproof properties. It is also known to use a plasma-CVD silicon nitride film as the final insulating film. This plasma-CVD silicon nitride film can be formed at a low temperature and has excellent mechanical and chemical blocking properties. However, the plasma-CVD silicon nitride film has a poor gettering effect. In order to compensate the above-mentioned drawbacks of the known insulating film, it has been further proposed to use a double-layer final insulating layer in which a plasma-CVD silicon nitride film is formed on a PSG film. Such a final passivation film is disclosed in Japanese Patent Application Laid-open Publications Kokai Sho 60-214534 and 63-84122.

FIG. 1 is a cross-sectional view showing the above-mentioned known semiconductor device in which the final insulating layer is formed by a double-layer of a PSG film and a plasma-CVD silicon nitride film. As illustrated in FIG. 1, an aluminum wiring pattern 1 is formed on an insulating film in the form of protrusions and a PSG film 2 is formed on the wiring pattern 1. A plasma-CVD silicon nitride film 4 is formed on the PSG film 2. The PSG film 2 does not have a sufficient step coverage due to its low flattening characteristic. Therefore, when the PSG film 2 is formed on the aluminum wiring pattern 1, there are formed overhangs 3 corresponding to the protrusions of the wiring pattern 1. Moreover, the plasma-CVD silicon nitride film 4 formed on the PSG film 2 has similar overhangs 5 as those of the underlying PSG film 2. At these overhangs 3 and 5, the thickness of the insulating layer, particularly the upper plasma-CVD silicon nitride film, becomes very thin. The plasma-CVD process for forming the plasma-CVD silicon nitride film 4 is generally carried out by utilizing a parallel electrode type plasma CVD apparatus. The movement of ions is predominantly limited to the up and down direction, so that the plasma-CVD silicon nitride film 4 is liable to be porous, and thus it does not have sufficient moisture resistance and waterproof properties necessary for the final passivation layer. This results in a serious deterioration in the reliability of the semiconductor device. Similar drawbacks would equally occur in the primary insulating layer and interlayer-insulating film.

In order to mitigate the above-explained drawback, it is proposed to increase the thickness of the upper plasma-CVD silicon nitride film. However, this solution might cause another problem because the plasma-CVD silicon nitride has a large residual stress, so that the thick silicon nitride film might cause the aluminum wiring pattern to deform and break, introducing cracks and aluminum slide into the semiconductor device. Further, it would be difficult to obtain the required precision for etching pads. Moreover, there might be a problem in the anti-plasma property against the resist for use in the pad etching.

SUMMARY OF THE INVENTION

The present invention provides a novel and useful semiconductor device including an insulating film having an excellent step coverage at a low temperature.

The invention also provides a semiconductor device with a final passivation layer having excellent gettering, moisture resistance and waterproof characteristics.

According to the invention, a semiconductor device comprises:
 a semiconductor substrate having a main surface;
 a metal wiring pattern formed on the main surface of the semiconductor substrate; and
 an insulating layer including a borophosphosilicate glass film formed by a chemical vapor deposition of a gaseous mixture of an organic silane, alkoxides of boron and phosphorus and ozone under atmospheric pressure.

In a preferred embodiment of the semiconductor device according to the invention, the insulating layer further comprises a plasma-CVD silicon nitride film formed on the borophosphosilicate glass film. Such an insulating layer is particularly suitable as the final passivation layer of the semiconductor device.

The present invention also relates to a method of manufacturing a semiconductor device and provides a novel and useful method of manufacturing a semiconductor device comprising an insulating film having excellent gettering, moisture resistance and waterproof properties.

According to the invention, a method of manufacturing a semiconductor device comprises the steps of:
 forming active regions in a semiconductor substrate;
 forming a metal wiring pattern on the semiconductor substrate; and
 forming a borophosphosilicate glass film over the metal wiring pattern by chemical vapor deposition by introducing the semiconductor substrate into a reaction vessel kept at atmospheric pressure and supplying a gaseous mixture of an organic silane, alkoxides of boron and phosphorus and ozone.

In a preferred embodiment of the method according to the invention, after the borophosphosilicate glass film has been formed, the semiconductor substrate is introduced into a plasma-CVD reactor and a plasma-CVD silicon nitride film is formed on the borophosphosilicate glass film by introducing a gaseous mixture of $SiH_4$, $NH_3$ and $N_2$ into the reactor.

BRIEF DESCRIPTION OF THE DRAWINGS

FIG. 1 is a cross-sectional view showing a known semiconductor device having an insulating layer made of a phosphosilicate glass film and a plasma-CVD silicon nitride film;

FIG. 2 is a cross-sectional view illustrating a part of an embodiment of the semiconductor device according to the invention;

FIG. 3 is a cross-sectional view depicting defects formed in the known semiconductor device;

DETAILED EXPLANATION OF PREFERRED EMBODIMENTS

Figure 4:
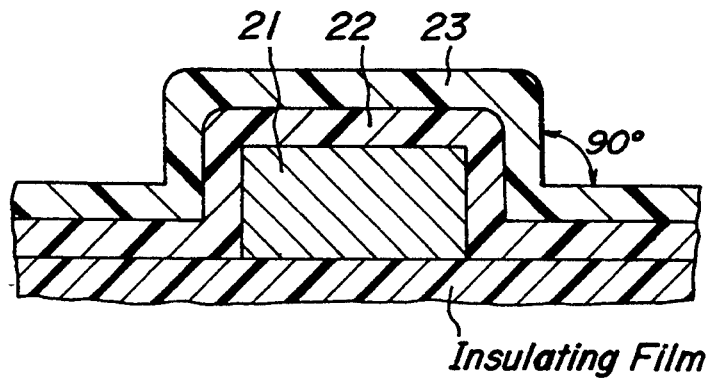
FIG. 4 is a cross-sectional view showing the step coverage of the insulating layer of the known semiconductor device.

FIG. 2 is schematic view showing part of an embodiment of the semiconductor device according to the invention. On an aluminum wiring pattern 11 formed on an insulating film such as a silicon oxide film provided on a main surface of a semiconductor substrate, there are formed a borophosphosilicate glass (BPSG) film 12 and a plasma-CVD silicon nitride film 13. According to the invention, the BPSG film 12 is formed by chemical vapor deposition by introducing the semiconductor substrate into a reaction vessel kept at atmospheric pressure and supplying a gaseous mixture of an organic silane, alkoxides of boron and phosphorus, and ozone into the reaction vessel. A known BPSG film formed by an atmospheric pressure CVD process using $SiH_4$ gas has to be reflowed in order to obtain a flat surface. During this reflow process, the aluminum wiring pattern 11 is subject to a high temperature and might be melted. The BPSG film 12 formed by the organic silane-$O_3$ atmospheric pressure-CVD according to the invention has an excellent step coverage, so that even if the aluminum wiring 11 has a large step, the BPSG film 12 has a rather flat surface as depicted in FIG. 2. This is due to the fact that in the organic silane-$O_3$ atmospheric pressure-CVD process, the ozone gas is very active and the organic silane such as TEOS (tetra ethyl ortho silicate) is easily decomposed at a low temperature so that phosphorus and boron atoms are introduced into the borophosphosilicate glass film. The phosphorus and boron atoms decrease the viscosity of the film so that the step coverage is improved. Moreover, the plasma-CVD silicon nitride film 13 also has a flat surface, and thus has excellent moisture resistance and waterproof properties.

Therefore, the insulating layer according to the invention formed by the organic silane-$O_3$ atmospheric pressure CVD film 12 and the plasma CVD silicon nitride film 13 is particularly suitable as the uppermost final passivation layer of the semiconductor device. However, the insulating layer according to the invention may be advantageously used as the primary insulating layer for protecting the active regions formed in the semiconductor substrate and the interlayer-insulating layer provided between successive wiring pattern layers. For instance, when the organic silane-$O_3$ atmospheric pressure-CVD film according to the invention is used as the interlayer-insulating layer, an upper aluminum wiring pattern having a uniform thickness can be formed on the insulating layer having a flat surface and undesired breakage of the upper aluminum wiring pattern can be effectively avoided.

In the present embodiment, the borophosphosilicate glass film 11 has a thickness of about 6000 Å and the plasma CVD silicon nitride film 12 has a thickness of about 4000 Å. According to the present invention, it is preferable that the borophosphosilicate glass film is deposited to have a thickness of 2000~10000 Å and the plasma CVD silicon nitride film is formed to have a thickness of 2000~5000 Å. Then, the thickness of the plasma CVD silicon nitride film having a large residual stress can be made smaller, so that the influence upon the underlaying metal wiring can be reduced to a large extent. Moreover, by reducing the thickness of the plasma CVD silicon nitride film, the amount of hydrogen (H) contained in this film is correspondingly decreased, so that fluctuation in electric characteristics of transistors can be avoided and the problem of the pad etching can be eliminated.

In a preferred embodiment of the method of forming the insulating layer according to the invention, TEOS gas, TMP (tri methyl phosphate) gas, TMB (tri methyl borate) gas and ozone gas are supplied into a reaction vessel in which a silicon wafer is placed. In this case nitrogen gas may be used as a carrier gas. The reaction vessel is maintained at atmospheric pressure (760 Torr) and the silicon wafer is heated at a temperature of 350°~450° C. The above-mentioned gases are supplied into the reaction vessel at the following preferable flow rates under the following conditions.

| | |
|---|---|
| TEOS ($Si(OC_2H_5)_4$) | 50~220 SCCM4 |
| TMP ($PO(OCH_3)_3$) | 3~100 SCCM |
| TMB ($B(OCH_3)_3$) | 6~150 SCCM |
| $O_3$ (100%) | 0.2~100 SCCM |
| substrate temperature | 350~450° C. |
| pressure | atmospheric pressure |

Further, the plasma-CVD silicon nitride film can be advantageously formed under the following conditions, while the silicon wafer is placed in a plasma-CVD reactor.

| | |
|---|---|
| substrate temperature | 300~400° C. |
| pressure | 0.2~1.0 Torr |
| $SiH_4$ | 300~2000 SCCM |
| $NH_3$ | 30~300 SCCM |
| $N_2$ | 400~2000 SCCM |

EXAMPLE I

After necessary regions have been formed in a silicon substrate, an aluminum film having a thickness of 1 μm was formed on a main surface of the silicon substrate, and then the aluminum film was selectively etched to form a desired wiring pattern. Next, a BPSG film having a thickness of about 6000 Å was formed on the wiring pattern by chemical vapor deposition under the following conditions.

| | |
|---|---|
| substrate temperature | 400° C. |
| pressure | atmospheric pressure |
| TEOS ($Si(OC_2H_5)_4$) | 100 SCCM |
| TMP ($PO(OCH_3)_3$) | 10 SCCM |
| TMB ($B(OCH_3)_3$) | 10 SCCM |
| $O_3$ (100%) | 3 SCCM |

Then, a plasma-CVD silicon nitride film having a thickness of about 4000 Å was formed on the BPSG film under the following conditions.

| substrate temperature | 400° C. |
|---|---|
| pressure | 0.35 Torr |
| SiH₄ | 1000 SCCM |
| NH₃ | 300 SCCM |
| N₂ | 1100 SCCM |

COMPARATIVE EXAMPLE

As a comparative example, an insulating layer was formed by an atmospheric pressure-CVD PSG film having a thickness of 6000 Å and a plasma-CVD film having a thickness of 4000 Å. The plasma-CVD silicon nitride film was formed in the same manner as that of the plasma-CVD silicon nitride film of the above-mentioned example of the present invention. The PSG film was formed under the following conditions.

| substrate temperature | 400° C. |
|---|---|
| pressure | atmospheric pressure |
| SiH₄ | 400 SCCM |
| PH₃ | 30 SCCM |
| O₂ | 100 SCCM |

Next the anti-BHF etching property and the step coverage of the final insulating layers formed by the methods described in the above example and comparative example were measured. The anti-BHF etching property was measured by etching the insulating layers for five minutes with the aid of 10:1 BHF and then cross-sections were observed by means of SEM (scanning type electron microscope). The anti-BHF etching property was estimated by etching conditions of lower side wall portions of overhangs. The step coverage was estimated by observing the cross-sections and calculating inclined angles of the side wall portions of the insulating layers.

Figure 5:
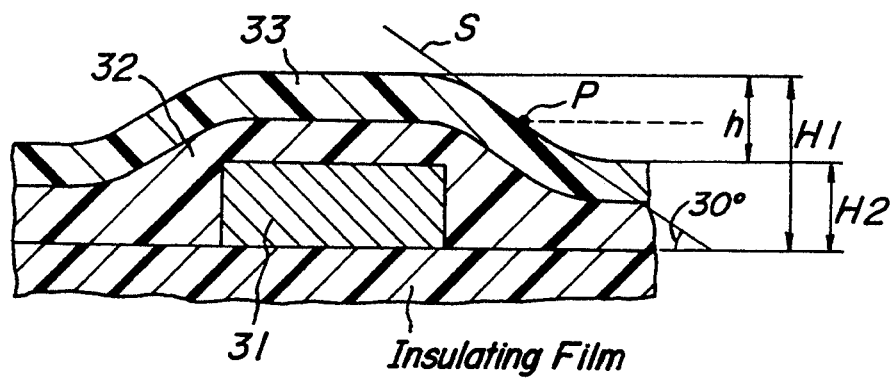
FIG. 5 is a cross-sectional view illustrating the step coverage of the insulating layer of the semiconductor device according to the invention.

FIGS. 3 and 4 are cross-sections of the known insulating layers formed on an aluminum wiring pattern 21 and consisting of a PSG film 22 formed on the aluminum wiring pattern 21 and a plasma-CVD silicon nitride film 23 formed on the PSG film 22. As shown in FIG. 3, in the known insulating layer, at the lower side wall portions there are formed slits or cracks which extend up to the aluminum wiring pattern 21. Further, as depicted in FIG. 4, the side wall of the insulating layer extends substantially perpendicularly to the remaining portion. That is to say, the inclination angle of the side wall portion of the step is about 90 degrees. In the insulating layer according to the invention, the BPSG film 32 formed on an aluminum wiring pattern 31 has an excellent step coverage and a substantially flat surface. Therefore, the plasma-CVD silicon nitride film 33 also has a flat surface as shown in FIG. 5. The step coverage was estimated as an angle of a tangential line S which is drawn at a middle point P on the side wall of the final passivation layer, with respect to a plane which is in parallel with the surface of the silicon substrate. Point P was determined as a point which bisects a distance h between heights H1 and H2 (h=H1—H2). Height H1 is a distance from the surface of the underlaying insulating film to the upper surface of the plasma CDV silicon nitride film 33 at a portion above the aluminum wiring pattern 31. Height H2 is a distance from the surface of the underlaying insulating film to the upper surface of the plasma CVD silicon nitride film at a portion except for the aluminum wiring pattern. In the semiconductor device according to the invention, this angle is very small, such as about 30°.

EXAMPLE II

In the above explained Example I, TEOS gas was used as the organic silane gas, but in the present example II HMDS (hexs methyl disiloxane) was used as the raw material gas. A BPSG film having a thickness of about 6000 Å was first formed under the following conditions.

| substrate temperature | 400° C. |
|---|---|
| pressure | atmospheric pressure |
| HMDS | 100 SCCM |
| TMP | 20 SCCM |
| TMB | 10 SCCM |
| O₃ (100%) | 5 SCCM |

Then a silicon nitride film having a thickness of about 4000 Å was formed by the plasma-CVD process under the same conditions as that of Example I. The thus formed final passivation film had an excellent gettering property as well as superior moisture resistance and waterproof properties.

According to the invention, when using HMDS as the organic silane to form the BPSG film, the atmospheric pressure CVD process is preferably performed under the following conditions.

| substrate temperature | 350~450° C. |
|---|---|
| HMDS | 50~220 SCCM |
| TMP | 10~50 SCCM |
| TMB | 5~20 SCCM |
| O₃ (100%) | 3~10 SCCM |

As explained above in detail, according to the invention, it is possible to obtain an insulating layer having excellent step coverage, moisture resistance and waterproof properties without increasing the thickness of the insulating layer. Therefore, the insulating layer according to the invention comprising a BPSG film formed by chemical vapor deposition of the organic silane-O₃ atmospheric pressure CVD and a plasma-CVD silicon nitride film is particularly suitable as the uppermost final insulating layer of the semiconductor device. Further, because the organic silane-O₃ atmospheric pressure CVD BPSG film has an excellent step coverage at a low temperature, it is no longer necessary to perform the reflow process, and thus the wiring pattern is not subjected to the high temperature heating and can be protected against melting.

The present invention is not limited to the embodiments explained above, but many alternations and modifications may be conceived by those skilled in the art within the scope of the invention. For instance, in the above preferred embodiments, the BPSG film is formed by using TEOS and HMDS as the organic silane, but according to the invention other organic silanes, for instance OMCTS (octa methyl cyclo tetrasiloxine) may be utilized.

What is claimed is:

1. A method of manufacturing a semiconductor device comprising the steps of:
    forming active regions in a surface of a semiconductor substrate;

forming at least one metal wiring pattern on said surface of the semiconductor substrate;

forming a borophosphosilicate glass film directly on said metal wiring pattern and on an exposed portion of said surface of the semiconductor substrate by chemical vapor deposition by introducing the semiconductor substrate into a reaction vessel kept at atmospheric pressure and supplying a gaseous mixture of an organic silane, alkoxides of boron and phosphorus and ozone into the reaction vessel; and forming a plasma-CVD silicon nitride film on said borophosphosilicate glass film.

2. A method according to claim 1, wherein during said chemical vapor deposition, the semiconductor substrate is heated at a temperature of about 350° to 450° C.

3. A method according to claim 2, wherein said organic silane gas, alkoxide of boron gas, alkoxide of phosphorus gas and the ozone gas are supplied into the reaction vessel at flow rates within the following flow rate ranges:

| organic silane gas | 50~220 SCCM |
| --- | --- |
| alkoxide of boron gas | 5~150 SCCM |
| alkoxide of phosphorus gas | 3~100 SCCM |
| ozone gas (100%) | 0.2~100 SCCM |

4. A method according to claim 1, wherein said borophosphosilicate glass film is formed on the main surface of the semiconductor substrate as a primary insulating film after the active regions have been formed in the semiconductor substrate.

5. A method according to claim 1, wherein said borophosphosilicate glass film is formed between successive metal wiring patterns as an interlayer-insulating film.

6. A method according to claim 1, wherein said borophosphosilicate glass film is formed on the metal wiring pattern as a final passivation layer of the semiconductor device.

7. A method according to claim 1, wherein said organic silane is selected from a group consisting of tetra ethyl ortho silicate, hexa methyl disiloxane and octa methyl cyclo tetrasiloxane.

8. A method according to claim 7, wherein said organic silane gas, alkoxide of boron gas, alkoxide of phosphorus gas and the ozone gas are supplied into the reaction vessel at flow rates within the following flow rate ranges:

| organic silane gas | 50~220 SCCM |
| --- | --- |
| alkoxide of boron gas | 5~150 SCCM |
| alkoxide of phosphorus gas | 3~100 SCCM |
| ozone gas (100%) | 0.2~100 SCCM |

9. A method according to claim 8, wherein said organic silane gas is a tetra ethoxy silane gas, said alkoxide of boron gas is a tri methyl borate gas and said alkoxide of phosphorus gas is a tri methyl phosphate gas.

10. A method according to claim 9, wherein said plasma-CVD silicon nitride film is formed by introducing the semiconductor substrate into a plasma CVD reactor, heating the semiconductor substrate at a temperature within a range of 300° to 400° C., and supplying a silane gas, $NH_3$ gas and $N_2$ gas at flow rates within the following ranges into the plasma-CVD reactor which is kept at a pressure within a range of 0.2~1.0 Torr:

| $SiH_4$ | 300~2000 SCCM |
| --- | --- |
| $NH_3$ | 30~300 SCCM |
| $N_2$ | 400~2000 SCCM |

11. A method according to claim 10, wherein said borophosphosilicate glass film is deposited to have a thickness of 2000~10000 Å and said plasma-CVD silicon nitride film is deposited to have a thickness of 2000~5000 Å.

12. A method according to claim 11, wherein said borophosphosilicate glass film is deposited to have a thickness of about 6000 Å and said plasma-CVD silicon nitride film is deposited to have a thickness of about 4000 Å.

* * * * *